(12) United States Patent
Sakamoto et al.

(10) Patent No.: US 7,170,476 B2
(45) Date of Patent: Jan. 30, 2007

(54) FIXED PATTERN DISPLAY PANEL AND METHOD FOR PRODUCING FIXED PATTERN DISPLAY PANEL

(75) Inventors: Tsuyoshi Sakamoto, Tsurugashima (JP); Hideo Ochi, Tsurugashima (JP); Masami Tsuchida, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 682 days.

(21) Appl. No.: 10/657,697

(22) Filed: Sep. 8, 2003

(65) Prior Publication Data
US 2004/0125052 A1   Jul. 1, 2004

(30) Foreign Application Priority Data
Sep. 11, 2002   (JP) ............... 2002-264988

(51) Int. Cl.
*G09G 3/30* (2006.01)
(52) U.S. Cl. ......................................... 345/76; 345/82

(58) Field of Classification Search ................. 345/76, 345/82; 445/24; 313/483; 315/169.1–169.3
See application file for complete search history.

(56) References Cited

U.S. PATENT DOCUMENTS

| | | | | |
|---|---|---|---|---|
| 5,459,589 A | * | 10/1995 | Ohnishi et al. | ............. 358/518 |
| 5,602,655 A | * | 2/1997 | Arakawa et al. | ............. 358/501 |
| 5,703,696 A | * | 12/1997 | Sakai et al. | ............. 358/404 |
| 2004/0141204 A1 | * | 7/2004 | Sakai et al. | ............. 358/1.16 |

* cited by examiner

*Primary Examiner*—Ricardo Osorio
(74) *Attorney, Agent, or Firm*—Drinker Biddle & Reath LLP

(57) ABSTRACT

A method for producing a fixed display panel using a matrix display panel. In the method, the holding state of memory elements of a plurality of pixels of the matrix display panel is changed to one of two values, in accordance with the predetermined fixed pattern, m driving lines are jointly connected as a first electrode and n scanning lines are jointly connected as a second electrode.

7 Claims, 4 Drawing Sheets

FIXED PATTERN DISPLAY PANEL AND METHOD FOR PRODUCING FIXED PATTERN DISPLAY PANEL

BACKGROUND OF THE INVENTION

1. Field of the Invention

The present invention relates to a display panel for displaying a fixed pattern and a method for producing the display panel.

2. Description of the Related Background Art

In display panels used for displaying the operating status in AV (audio-visual) equipment, such as car stereo sets or DVD players, many display panels display only a predetermined fixed pattern.

Conventionally, in order to display a fixed pattern including texts or images on a display panel, it was necessary to form the panel as a segment display panel at the manufacturing stage of the display panel. That is to say, the display panel itself was manufactured as a display panel for fixed pattern display.

However, with conventional display panels for fixed pattern display, it is impossible to alter the pattern after the manufacturing process to a pattern different from the specified fixed pattern, so that they had no versatility at all. Moreover, with conventional display panels for fixed pattern display, manufacturing only a small number of display panels for displaying a specific fixed pattern leads to increased costs, and it is difficult to manufacture display panels with a desired fixed pattern in short time.

SUMMARY OF THE INVENTION

It is an object of the present invention to provide a method for producing a fixed display panel, with which a display panel displaying a desired fixed pattern can be produced in a short time and at low cost, and a display panel displaying the desired fixed pattern.

According to the present invention, there is provided a method for producing a fixed pattern display panel from a matrix display panel including m driving lines (m is an integer which is equal to or greater than two); n scanning lines (n is an integer which is equal to or greater than two)) intersecting with the m driving lines; and a plurality of pixel portions arranged at intersections of the m driving lines and the n scanning lines, each of the pixel portions having a non-volatile binary memory element and a light-emitting element, wherein, when the memory element holds one of two values, the light-emitting element is in an electrically disconnected state between one of the m driving lines and one of the n scanning lines, and when the memory element holds the other of the two values, the light-emitting element is in an electrically connected state between the one driving line and the one scanning line; the method comprising: a writing step of changing the holding state of each of the memory elements of the plurality of pixels to one or the other of the two values, in accordance with a predetermined fixed pattern; and an electrode producing step of jointly connecting the m driving lines as a first electrode and jointly connecting the n scanning lines as a second electrode.

According to the present invention, there is provided a fixed pattern display panel, comprising: m driving lines (m is an integer which is equal to or greater than two); n scanning lines (n is an integer which is equal to or greater than two) intersecting with the m driving lines; a plurality of pixel portions arranged at intersections of the m driving lines and the n scanning lines, each of the pixel portions having a non-volatile binary memory element and a light-emitting element, wherein, when the memory element holds one of two values, the light-emitting element is in an electrically disconnected state between one of the m driving lines and one of the n scanning lines, and when the memory element holds the other of the two values, the light-emitting element is in an electrically connected state between the one driving line and the one scanning line; a first electrode to which the m driving lines are jointly connected; and a second electrode to which the n scanning lines are jointly connected.

According to the present invention, there is provided a data writing apparatus for writing fixed pattern data into memory elements of a matrix display panel including m driving lines (m is an integer which is equal to or greater than two); n scanning lines (n is an integer which is equal to or greater than two) intersecting with the m driving lines; a plurality of pixel portions arranged at intersections of the m driving lines and the n scanning lines, each of the pixel portions having a non-volatile binary memory element and a light-emitting element, wherein, when the memory element holds one of two values, the light-emitting element is in an electrically disconnected state between one of the m driving lines and one of the n scanning lines, and when the memory element holds the other of the two values, the light-emitting element is in an electrically connected state between the one driving line and the one scanning line; the writing apparatus comprising: a device which produces m×n bits of pattern data corresponding to a predetermined fixed pattern; a scanning device which applies a ground potential to the n scanning lines one by one in a predetermined order; and a driving device which retrieves m bits from the m×n bits of pattern data that correspond to one scanning line that is currently being scanned, and applies the writing voltage to driving lines corresponding to bits, that indicate light emission, of the m bits.

DETAILED DESCRIPTION OF THE PREFERRED EMBODIMENTS

The following is a detailed description of embodiments of the present invention, with reference to the accompanying drawings.

Figure 1:
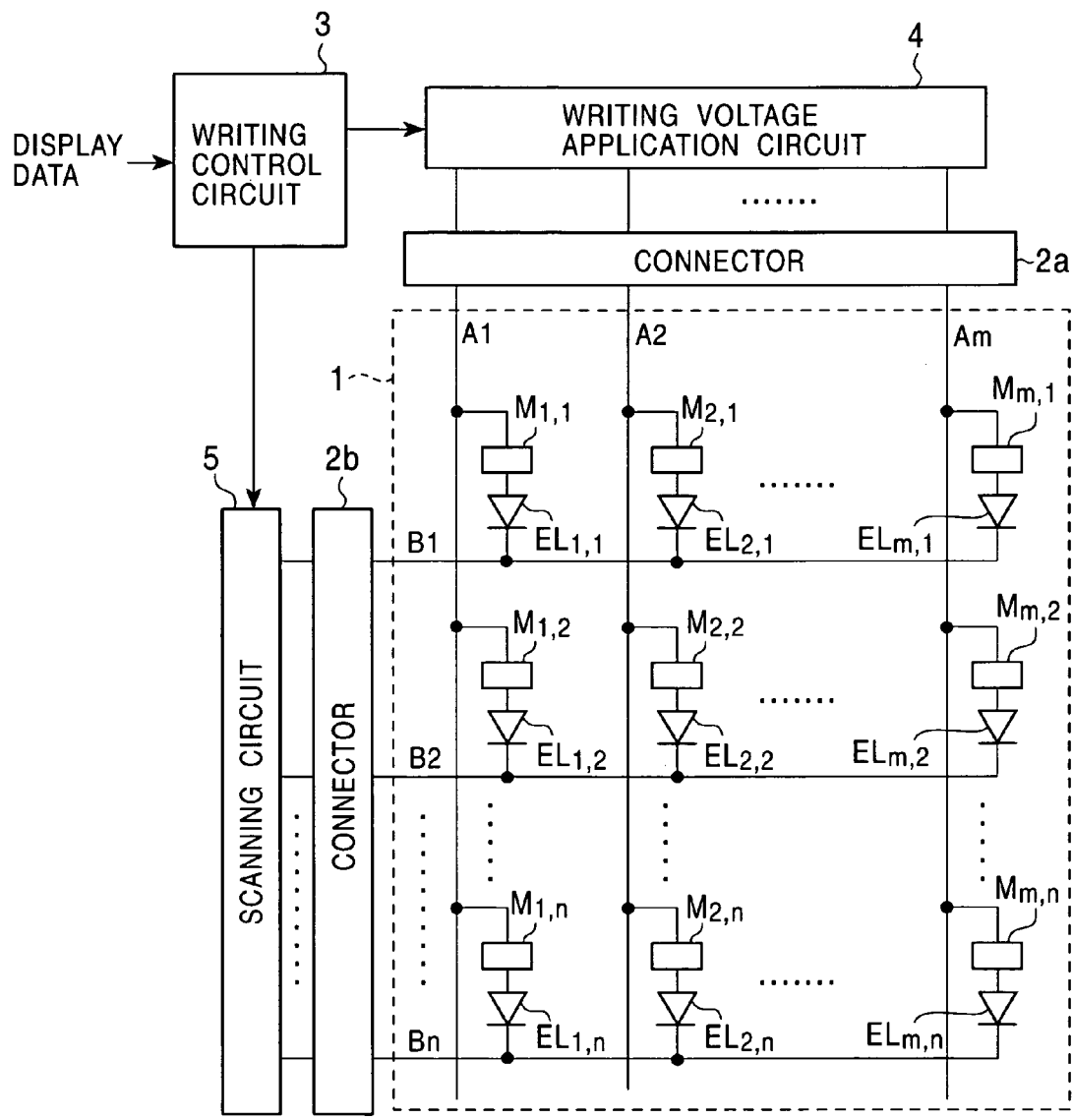
FIG. 1 is a block diagram showing the configuration of a display panel writing apparatus used in a method for producing a fixed pattern display panel according to the present invention.

FIG. 1 shows a display panel writing apparatus used in a method for producing a fixed display panel according to the present invention. The writing apparatus, which writes display data onto a display panel 1, includes connectors 2a and 2b, a writing control circuit 3, a writing voltage application circuit 4, and a scanning circuit 5.

The display panel 1 is a matrix display panel provided with a plurality of driving lines A1 to Am (with m being an integer of two or greater) arranged parallel to one another and a plurality of scanning lines B1 to Bn (with n being an integer of two or greater) arranged parallel to one another. The plurality of driving lines A1 to Am and the plurality of scanning lines B1 to Bn intersect each other. Series circuits of organic memory elements $M_{1,1}$ to $M_{m,n}$ and organic EL elements (organic electroluminescent element) $EL_{1,1}$ to $EL_{m,n}$ are formed as pixel portions at the intersections between the driving lines A1 to Am and the scanning lines B1 to Bn. The driving lines A1 to Am and the scanning lines B1 to Bn each include a terminal portion protruding from the main unit portion of the display panel 1.

The organic memory elements $M_{1,1}$ to $M_{m,n}$ have a two-terminal switching function, and are commonly known as OBDs (organic bistable memory devices). As long as in the initial state of these elements a voltage that is lower than a threshold voltage Vth (e.g. 3V) is applied across the two terminals, the impedance of these elements is high, and as switches they are in an OFF state. If a writing voltage that is equal or higher than the threshold voltage Vth is temporarily applied across the two terminals, the impedance of the elements becomes low, and as switches they are in an OFF state. Once they take on a low impedance, this low-impedance state is held as long as no reverse bias is applied to the element.

The connectors 2a and 2b mount the display panel 1 detachably on the writing apparatus. The connector 2a is a device providing a mechanical and electrical connection between the terminal portions of the plurality of driving lines A1 to Am of the display panel 1 and the writing voltage application circuit 4. The connector 2b is a device providing a mechanical and electrical connection between the terminal portions of the plurality of scanning lines B1 to Bm of the display panel 1 and the scanning circuit 5.

The display data for a pattern to be displayed on the display panel 1 is entered into the writing control circuit 3. The display data may be image data of pixel units, such as bitmap data, or it may be compressed image data, such as JPEG data. It may also be text data, or a combination of image data and text data. The writing control circuit 3 creates m×n bits of pattern data corresponding to the pixels of the display panel 1 in accordance with the input display data, and generates a writing control signal and a scanning control signal in progressive (line-at-a-time) scanning format in accordance with the pattern data. The scanning control signal is generated so as to successively specify one of the scanning lines B1 to Bn, and is supplied to the scanning circuit 5. The writing control signal is generated for each line (m bits) of the pattern data in synchronization with the scanning timing of the scanning control signal, and supplied to the writing voltage application circuit 4.

The writing voltage application circuit 4 outputs a writing signal for m bits in accordance with the writing control signal, via the connector 2a to the driving lines A1 to Am. The writing signal is a signal for applying a writing voltage to the driving lines corresponding to EL elements that are supposed to emit light, and for applying a ground potential to the driving lines corresponding to the other EL elements that are not supposed to emit light or leaving those driving lines open.

The scanning circuit 5 applies via the connector 2b, in accordance with the scanning control signal, the ground potential successively to each of the scanning lines B1 to Bn at predetermined scanning intervals, in the order.

In the display panel writing apparatus with this configuration, a display panel 1 in the initial state is first mounted with the connectors 2a and 2b. After mounting the display panel 1, display data is input into the writing control circuit 3. The display data is supplied for example from a personal computer (not shown in the drawings) to the writing control circuit 3. In response to the display data, the writing control circuit 3 creates m×n bits of pattern data corresponding to the pixels of the display panel 1, and generates the writing control signal and the scanning control signal in the line sequential scanning format in accordance with the pattern data.

In response to the scanning control signal, the ground potential is applied successively from the scanning circuit 5 via the connector 2b to each of the scanning lines B1 to Bn at predetermined scanning intervals, in that order. In synchronization with the scanning for each scanning line, a writing signal corresponding to the writing control signal is output from the writing voltage application circuit 4 via the connector 2a to the driving lines A1 to Am.

During the scanning period of the scanning line B1 in which the ground potential is applied to the scanning line B1, a writing signal is generated that corresponds to the m bits of the first line of the m×n bits of pattern data. If the first bit of the m bits of that writing signal, that is, the bit component corresponding to the driving line A1, has a writing voltage, then this writing voltage is applied to the series circuit of the organic memory element $M_{1,1}$ and the organic EL element $EL_{1,1}$ located between the driving line A1 and the scanning line B1. The organic memory element $M_{1,1}$ has a high impedance in its initial state, and this high impedance is sufficiently large compared to the organic EL element $E_{1,1}$. Consequently, a voltage which is equal to or higher than the threshold voltage Vth is applied to the two terminals of the organic memory element $M_{1,1}$. Thus, the organic memory element $M_{1,1}$ changes to a low impedance, and becomes the ON state. This low impedance is held by the organic memory element $M_{1,1}$.

Since the organic memory element M1,1 has the low impedance, a current by the writing voltage flows from the writing voltage application circuit 4 to the scanning circuit 5 through the connector 2a, the driving line A1, the organic memory element $M_{1,1}$, the organic EL element $EL_{1,1}$, the scanning line B1 and the connector 2b. In this situation, a voltage equal to or greater than the light-emission threshold voltage is applied to the organic EL element $EL_{1,1}$, so that the organic EL element $EL_{1,1}$ emits light.

If a writing voltage is supplied also to a driving line other than the driving line A1 during the scanning period of the scanning line B1, then the organic memory element corresponding to that driving line has a low impedance, just like for the driving line A1 described above, and the organic EL element connected to that organic memory element will emit light.

When the scanning period of the scanning line B1 is terminated, the scanning period of the next scanning line B2 starts, and a writing signal corresponding to the m bits of the second line of the m×n bits of pattern data is output from the writing voltage application circuit 4 via the connector 2a to the driving lines A1 to Am, in synchronization with that scanning.

When the above operation is repeated up to the scanning period of the scanning line Bn, the writing of data into the display panel 1 is terminated. The display panel 1 thus becomes a state, in which data has been written into the organic memory elements $M_{1,1}$ to Mm,n, in accordance with the m×n bits of pattern data. That is to say, the organic memory elements respectively connected in series to the organic EL elements in the display panel 1 that are supposed to emit light have a low impedance, and the organic memory elements respectively connected in series to the organic EL elements that are not supposed to emit light retain a high impedance.

Figure 2:
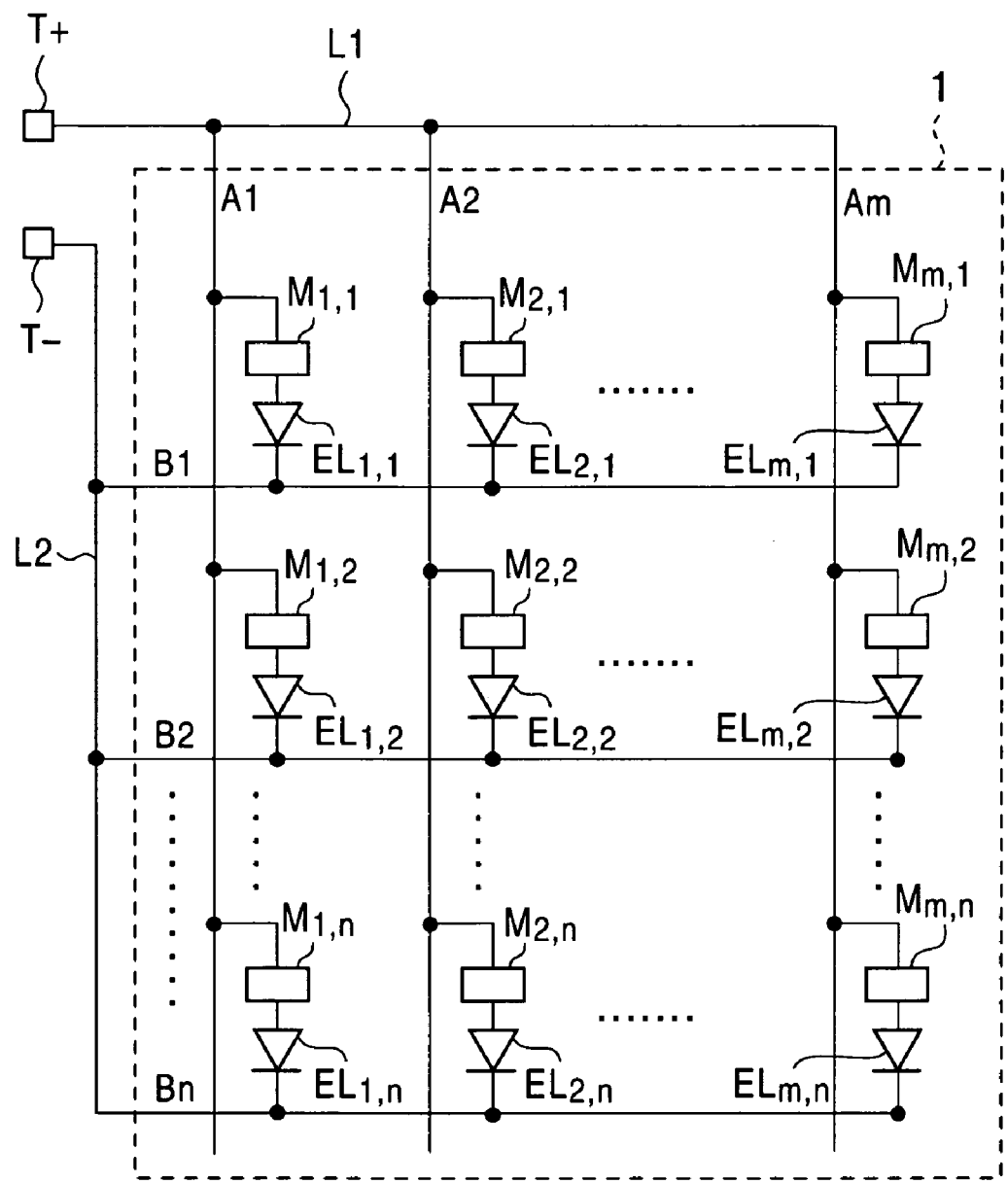
FIG. 2 is a diagram showing a display panel according to the present invention.

After that, the connectors 2a and 2b are disconnected to separate the display panel 1 from the writing apparatus. In the separated display panel 1, the terminal portions of the driving lines A1 to Am are jointly connected by the connection line L1, and the terminal portions of the scanning lines B1 to Bn are jointly connected by the connection line L2, as shown in FIG. 2. The joint connection of the terminal portions of the driving lines A1 to Am is connected to an anode terminal T+, and the joint connection of the terminal portions of the scanning lines B1 to Bn is connected to an cathode terminal T−. The anode terminal T+ and the cathode terminal T− are located outside the display panel 1 in FIG. 2, but they may also be arranged inside the display panel 1.

Figure 3:
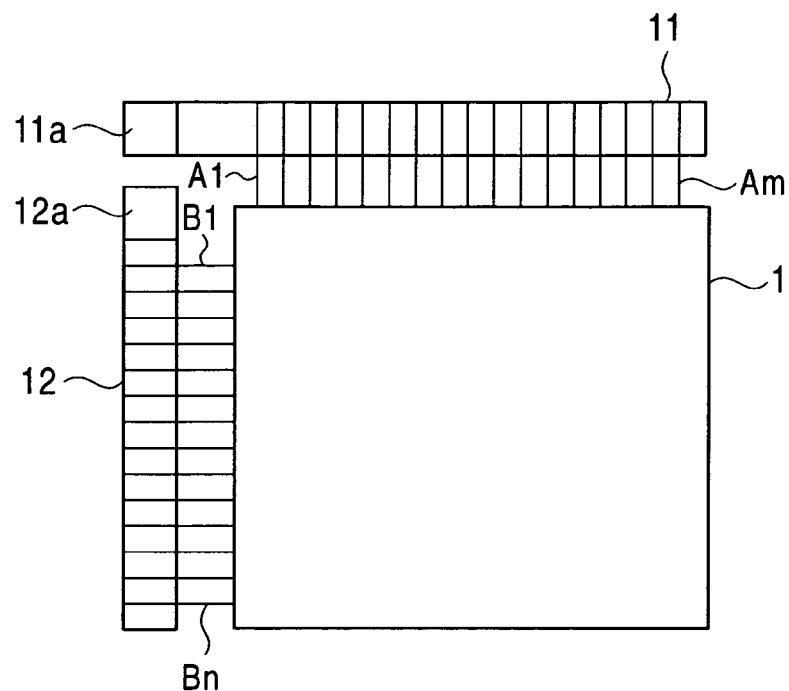
FIG. 3 is a diagram illustrating electrode terminal connections of the display panel.

More specifically, as shown in FIG. 3, the terminal portions of the driving lines A1 to Am are arranged on an anode-side lead electrode 11, and the driving lines A1 to Am are bonded to this lead electrode 11 with a conductive paste (not shown in the drawings). Similarly, the terminal portions of the scanning lines B1 to Bn are arranged on a cathode-side lead electrode 12, and the scanning lines B1 to Bn are bonded to this lead electrode 12 with a conductive paste. The lead electrodes 11 and 12 are made of an oblong, conductive, flat material, as can be seen in FIG. 3, and one end thereof is formed into electrode terminals 11a and 12a.

Figure 4:
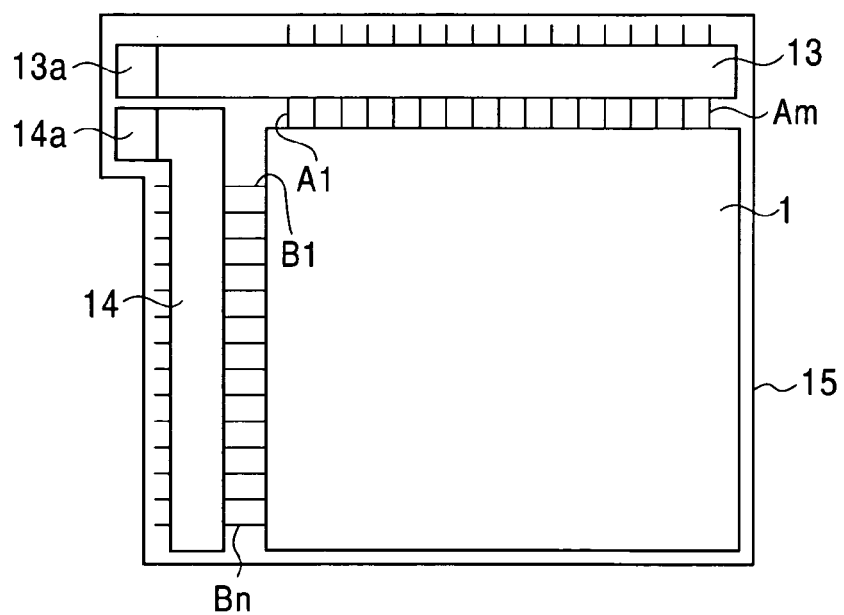
FIG. 4 is a diagram illustrating electrode terminal connections of the display panel.

As shown in FIG. 4, it is also possible to crimp the terminal portions of the driving lines A1 to Am with an anisotropically conductive film 13 to a substrate 15, and to crimp the terminal portions of the driving lines B1 to Bm with an anisotropically conductive film 14 to the substrate 15. In this case, one end of the anisotropically conductive film 13 serves as an anode terminal 13a, and one end of the anisotropically conductive film 14 serves as a cathode terminal 14a.

The display panel 1 on which anode and cathode electrodes are formed is a display panel produced with the method for producing a fixed display panel in accordance with the present invention, and may be sold as a product, for example. Alternatively, the display panel 1 on which the electrodes are formed may be used as a display panel for the fixed display of a pattern that is written by the user.

Figure 5:
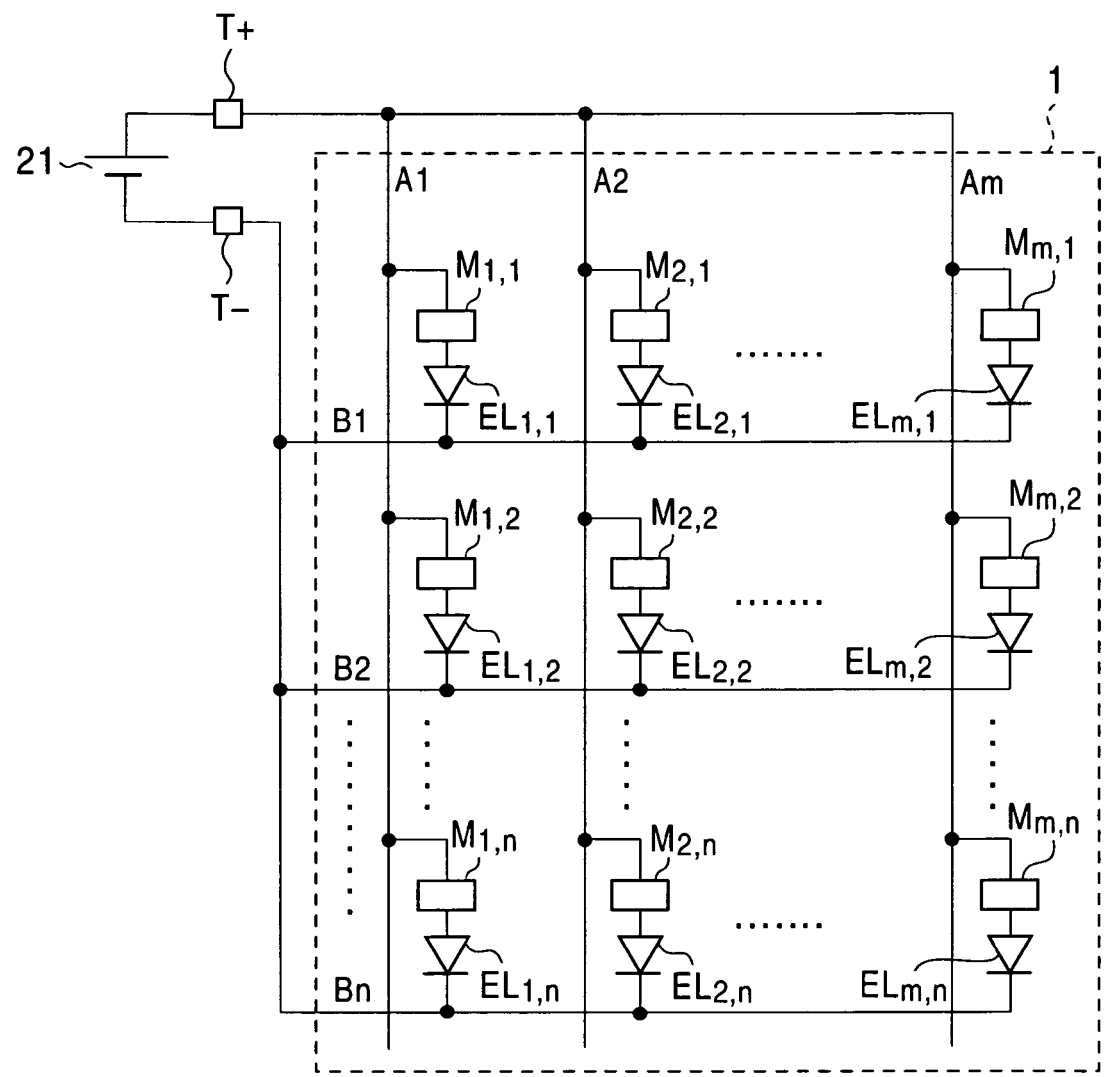
FIG. 5 is a diagram showing a driving configuration for the display panel.

The method for driving the display panel 1 may be a voltage driving method or a current driving method. As a simple voltage driving method, it is possible to connect a battery 21 between the anode terminal T+ and the cathode terminal T− of the display panel 1 to apply a predetermined DC voltage (that is lower than the threshold voltage Vth), as shown in FIG. 5. It is also possible to provide an on-off switch between the battery 21 and the anode terminal T+ or the cathode terminal T−. Furthermore, the battery 21, the anode terminal T+, and the cathode terminal T− (as well as the on-off switch if there is one) may be integrated into one piece with the display panel 1.

Regardless whether voltage driving or current driving is used, a driving current flows through the organic EL elements connected in series to the organic memory elements with low impedance, and this organic EL element emits light due to this driving current. On the other hand, hardly any current flows through the organic EL elements connected in series to the organic memory elements with high impedance, so that these organic EL elements do not emit light. With the emission or non-emission of light by the organic EL elements in the display panel 1, a pattern corresponding to the written data can be displayed.

It should be noted that in the above-described embodiment, the organic memory element and the organic EL element of each pixel portion of the display panel 1 are connected in series, but there is no limitation to the series connection. The organic memory element and the organic EL element of each pixel portion may also be connected in other ways, such as by parallel connections, as long as when the organic memory element is one of two states, the organic EL element is in an electrically disconnected state between the driving line and the scanning line, and when the organic memory element is in the other of the two states, then the organic EL element is in an electrically connected state between the driving line and the scanning line.

Moreover, the memory elements of the pixel portions of the matrix display panel are not limited to organic memory elements, as long as they are elements that can selectively store two states. Furthermore, the light-emitting elements of the pixel portions are not limited to organic EL elements, and may also be light-emitting elements such as LEDs.

Furthermore, the matrix display panel used in the present invention may be a monochrome display or a multicolor display.

According to the present invention as described above, it is possible to change the storage state of memory elements of a plurality of pixel portions to one or the other of two states in accordance with a predetermined fixed pattern, when using a matrix display panel. Furthermore, m driving lines are jointly connected as one electrode, and n scanning lines are jointly connected as another electrode, so that a display panel displaying any fixed pattern can be fabricated in short time and at low cost.

This application is based on a Japanese Patent Application No. 2002-264988 which is hereby incorporated by reference.

What is claimed is:

1. A method for producing a fixed pattern display panel from a matrix display panel including m driving lines (m is an integer which is equal to or greater than two); n scanning lines (n is an integer which is equal to or greater than two)) intersecting with the m driving lines; and a plurality of pixel portions arranged at intersections of the m driving lines and the n scanning lines, each of the pixel portions having a non-volatile binary memory element and a light-emitting element, wherein, when the memory element holds one of two values, the light-emitting element is in an electrically disconnected state between one of the m driving lines and one of the n scanning lines, and when the memory element holds the other of the two values, the light-emitting element is in an electrically connected state between the one driving line and the one scanning line; the method comprising:
   a writing step of changing the holding state of each of the memory elements of the plurality of pixels to one or the other of the two values, in accordance with a predetermined fixed pattern; and
   an electrode producing step of jointly connecting the m driving lines as a first electrode and jointly connecting the n scanning lines as a second electrode.

2. A method for producing a fixed pattern display panel according to claim 1,
   wherein the memory element and the light-emitting element are connected in series between one of the driving lines and one of the scanning lines in each of the plurality of pixel portions;
   wherein, in an initial state, the memory elements are in a high-impedance state which corresponds to the one value, and the memory elements can be changed to a low-impedance state which corresponds to the other value, by applying a writing voltage that is equal to or greater than a predetermined threshold voltage; and wherein in said writing step, a writing voltage is applied to the series circuit of the memory element and the light-emitting element in each pixel portion existing at locations on the display panel corresponding to the predetermined fixed pattern.

3. A method for producing a fixed pattern display panel according to claim 2, wherein, in the writing step, m×n bits of pattern data corresponding to the predetermined fixed pattern are produced;

wherein the n scanning lines are scanned one by one in a predetermined order, and a reference potential is applied to one scanning line that is currently being scanned; and wherein m bits corresponding to the one scanning line that is currently being scanned are retrieved from the m×n bits of pattern data, and the writing voltage is applied to the driving lines corresponding to bits, that indicate light emission, of the m bits.

4. A method for producing a fixed pattern display panel according to claim 2, wherein the memory elements are organic memory elements, and the light-emitting elements are organic electroluminescent elements.

5. A fixed pattern display panel, comprising:

m driving lines (m is an integer which is equal to or greater than two);

n scanning lines (n is an integer which is equal to or greater than two) intersecting with the m driving lines;

a plurality of pixel portions arranged at intersections of the m driving lines and the n scanning lines, each of the pixel portions having a non-volatile binary memory element and a light-emitting element, wherein, when the memory element holds one of two values, the light-emitting element is in an electrically disconnected state between one of the m driving lines and one of the n scanning lines, and when the memory element holds the other of the two values, the light-emitting element is in an electrically connected state between the one driving line and the one scanning line;

a first electrode to which the m driving lines are jointly connected; and a second electrode to which the n scanning lines are jointly connected.

6. A fixed pattern display panel according to claim 5, wherein the output voltage of a battery is applied between the first electrode and the second electrode.

7. A data writing apparatus for writing fixed pattern data into memory elements of a matrix display panel including m driving lines (m is an integer which is equal to or greater than two); n scanning lines (n is an integer which is equal to or greater than two) intersecting with the m driving lines; a plurality of pixel portions arranged at intersections of the m driving lines and the n scanning lines, each of the pixel portions having a non-volatile binary memory element and a light-emitting element, wherein, when the memory element holds one of two values, the light-emitting element is in an electrically disconnected state between one of the m driving lines and one of the n scanning lines, and when the memory element holds the other of the two values, the light-emitting element is in an electrically connected state between the one driving line and the one scanning line; the writing apparatus comprising:

a device which produces m×n bits of pattern data corresponding to a predetermined fixed pattern;

a scanning device which applies a ground potential to the n scanning lines one by one in a predetermined order; and driving device which retrieves m bits from the m×n bits of pattern data that correspond to one scanning line that is currently being scanned, and applies the writing voltage to driving lines corresponding to bits, that indicate light emission, of the m bits.

* * * * *